(12) United States Patent
Fujidai et al.

(10) Patent No.: US 8,971,054 B2
(45) Date of Patent: Mar. 3, 2015

(54) COMPONENT ASSEMBLY

(75) Inventors: Masanori Fujidai, Nagaokakyo (JP);
Kazuo Hattori, Nagaokakyo (JP);
Isamu Fujimoto, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 229 days.

(21) Appl. No.: 13/616,879

(22) Filed: Sep. 14, 2012

(65) Prior Publication Data

US 2013/0242517 A1    Sep. 19, 2013

Related U.S. Application Data

(63) Continuation of application No. PCT/JP2011/001853, filed on Mar. 29, 2011.

(30) Foreign Application Priority Data

Mar. 30, 2010   (JP) ................................. 2010-078108

(51) Int. Cl.
*H05K 1/18*   (2006.01)
*H05K 1/02*   (2006.01)
(Continued)

(52) U.S. Cl.
CPC ........ *H05K 1/0271* (2013.01); *H01L 23/49822* (2013.01); *H01L 23/50* (2013.01);
(Continued)

(58) Field of Classification Search
USPC ................................................ 361/760–766
See application file for complete search history.

(56) References Cited

U.S. PATENT DOCUMENTS

| 6,876,554 B1* | 4/2005 | Inagaki et al. ................. 361/763 |
| 2005/0199929 A1 | 9/2005 | Horikawa et al. |
| 2007/0087512 A1* | 4/2007 | Cho et al. ...................... 438/381 |

FOREIGN PATENT DOCUMENTS

| JP | 11-163524 A | 6/1999 |
| JP | 2000-260902 A | 9/2000 |

(Continued)

OTHER PUBLICATIONS

Official Communication issued in International Patent Application No. PCT/JP2011/001853, mailed on Jun. 28, 2011.
Official Communication issued in corresponding Japanese Patent Application No. 2012-230718, mailed on Aug. 27, 2013.

*Primary Examiner* — Tuan T Dinh
*Assistant Examiner* — Ahmad D Barnes
(74) *Attorney, Agent, or Firm* — Keating & Bennett, LLP

(57) ABSTRACT

A component assembly that can be easily built in a main substrate with high accuracy is formed such that a glass transition temperature of a built-in-component layer of an assembly substrate in which multiple capacitors are embedded is higher than a glass transition temperature of a built-in-component layer of a built-in-component substrate. Thus, thermal deformation of the component assembly is prevented when the built-in-component substrate in which the component assembly is built is heated during reflow, for example. The component assembly can thus be highly accurately built in the built-in-component substrate. Moreover, when the component assembly in which the multiple capacitors are embedded is built in the built-in-component substrate, electrode pads of the component assembly in which the multiple capacitors are embedded can be electrically connected to wiring layers of the built-in-component substrate by soldering despite the variation in height among the capacitors.

18 Claims, 6 Drawing Sheets

(51) Int. Cl.
*H01L 23/498* (2006.01)
*H01L 23/50* (2006.01)
*H05K 3/46* (2006.01)

(52) U.S. Cl.
CPC ............. *H05K 3/4602* (2013.01); *H05K 1/182* (2013.01); *H01L 23/49827* (2013.01); *H01L 2224/16225* (2013.01); *H05K 1/185* (2013.01); *H05K 2201/068* (2013.01); *H05K 2201/10636* (2013.01); *H05K 2201/10674* (2013.01)
USPC ............ 361/763; 361/761; 361/762; 361/764

(56) References Cited

FOREIGN PATENT DOCUMENTS

| | | |
|---|---|---|
| JP | 2001-007531 A | 1/2001 |
| JP | 2001-313467 A | 11/2001 |
| JP | 2002-100874 A | 4/2002 |
| JP | 2002-271034 A | 9/2002 |
| JP | 2005-217382 A | 8/2005 |
| JP | 2009-081183 A | 4/2009 |
| JP | 2009-158690 A | 7/2009 |
| JP | 2009-200189 A | 9/2009 |
| JP | 2009-212484 A | 9/2009 |

* cited by examiner

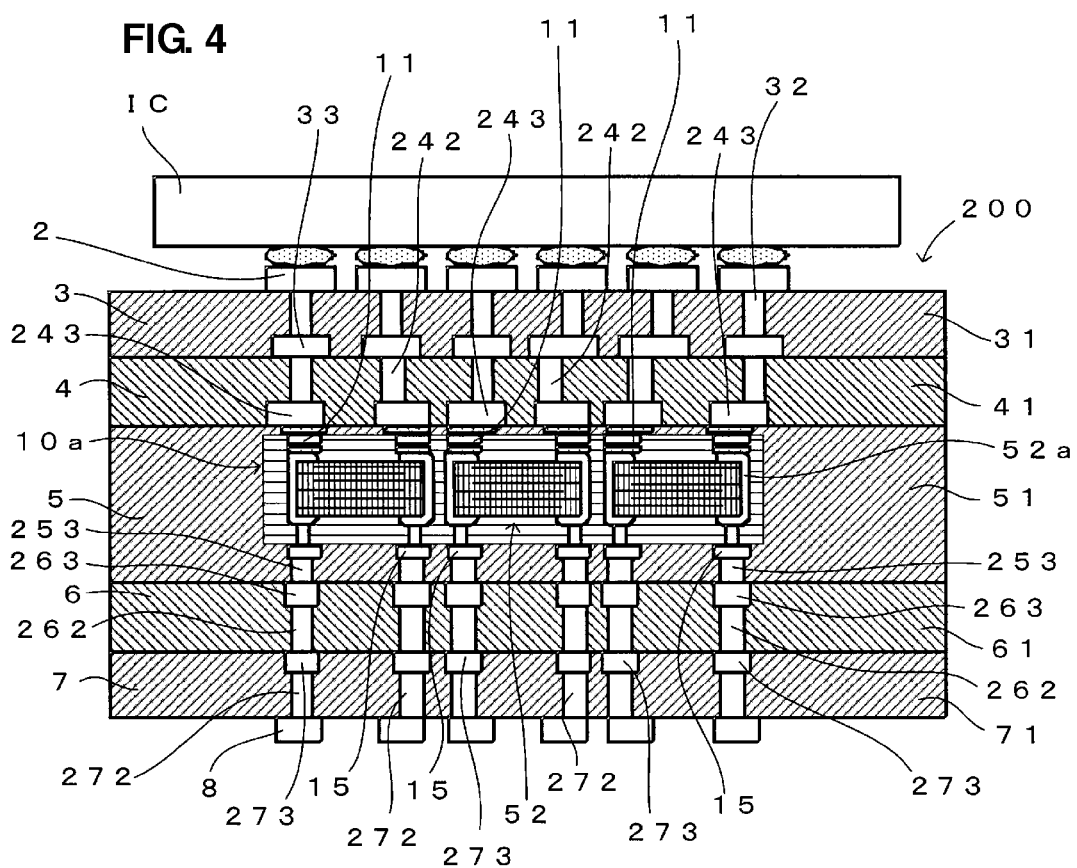

COMPONENT ASSEMBLY

BACKGROUND OF THE INVENTION

1. Field of the Invention

The present invention relates to a technology for integrally building multiple electronic components in a substrate.

2. Description of the Related Art

A capacitor unit that is formed by electrically connecting outer electrodes of multiple electronic components, such as multiple ceramic capacitors, to one another such that the multiple electronic components are integrated has heretofore been known (see, for example, Japanese Unexamined Patent Application Publication No. 2009-81183, specifically paragraphs [0026] to [0029], FIGS. 3 and 5, Abstract, and other portions). If a capacitor unit is built in a built-in-component substrate, a certain number of ceramic capacitors can be built in the built-in-component substrate more easily than in the case where the same number of ceramic capacitors are individually built in the built-in-component substrate.

In addition, when a capacitor unit is formed from cheap general-purpose ceramic capacitors each having a small capacitance, the capacitor unit can function as a large-capacitance capacitor. This dispenses with the need for an expensive large-capacitance capacitor, and thus the production cost of a built-in-component substrate can be reduced. This is also advantageous in terms of efficiency because a capacitor unit having desired characteristics can be easily formed by changing the number or the type of ceramic capacitors that constitute the capacitor unit.

Referring to FIGS. 7A and 7B, an example of a method of forming such a capacitor unit 500 will be described. Firstly, a die having a cavity is prepared, and a predetermined number of ceramic capacitors 501 are contained in the cavity. Here, the ceramic capacitors 501 are contained in the cavity such that outer electrodes 502 of adjacent ceramic capacitors 501 are adjacent to or in contact with each other.

The ceramic capacitors 501 in this example are formed as so-called chip-type multilayer ceramic capacitors, and each include dielectric ceramic layers 503, inner electrodes 504 that are disposed so as to face one another via the dielectric ceramic layers 503, and outer electrodes 502 that are connected with inner electrodes 504 led out to end surfaces of the body of the ceramic capacitor 501.

Subsequently, when low-melting metal layers on the surfaces of the outer electrodes 502 are heated to a melting temperature, adjacent outer electrodes 502 are bonded to one another as illustrated in FIG. 7A, so that a capacitor unit 500 in which the multiple ceramic capacitors 501 are integrated is formed.

As illustrated in FIG. 7B, the adjacent outer electrodes 502 are integrated and electrically connected to one another, and thus the multiple ceramic capacitors 501 function as an electrically singular capacitor. In other words, the capacitor unit 500 is formed by integrating the multiple ceramic capacitors 501 into a single component and by electrically connecting the ceramic capacitors 501 to one another. FIGS. 7A and 7B illustrate an example of a conventional capacitor unit 500, in which FIG. 7A is a plan view and FIG. 7B is a cross-sectional view of the capacitor unit 500 taken along the line A-A and viewed in the direction of the arrows A.

When a component assembly, typified by the capacitor unit 500, is built in a built-in-component substrate, an electrode of the component assembly and a wiring layer of the built-in-component substrate are connected to each other using solder or a via conductor. When the component assembly is connected to the wiring layer of the built-in-component substrate by soldering, the component assembly can be built in the built-in-component substrate by being easily mounted on the wiring layer with a well-known surface-mount technology. Thus, the production cost of the built-in-component substrate can be reduced.

Generally, the same resin material is used for substrate materials (core and pre-preg) of multilayer substrates, and the same resin material is also used for multilayer substrates in which components are built. A conceivable way of reducing the production cost of a built-in-component substrate is to make the built-in-component substrate out of a general-purpose resin material, i.e., a resin material having a low glass transition temperature (Tg) or a resin material having a large coefficient of linear expansion, for reduction of the production cost of the built-in-component substrate. With this method, however, the following may occur when a built-in-component substrate on whose wiring layer a component assembly is mounted by soldering is mounted on a motherboard by soldering or when another electronic component is mounted on a surface of the built-in-component substrate by soldering. If the built-in-component substrate is heated during reflow, for example, solder with which the component assembly is mounted on the wiring layer of the built-in-component substrate re-melts and the built-in-component substrate deforms, so that the solder that has re-melted and seeped out of a gap of the built-in-component substrate, the gap having been formed due to thermal deformation, may flash or the melting solder may cause a bridge. In view of this, a built-in-component substrate that is prevented from thermally deforming has to be formed while usable resin materials are limited. This makes it difficult to reduce the production cost of the built-in-component substrate. If a built-in-component substrate is made of a resin material having a low glass transition temperature (Tg) or a resin material having a large coefficient of linear expansion, the application range of the built-in-component substrate becomes limited, for example, the produced built-in-component substrate is not capable of coping with reflow or other operations.

When a component assembly is connected to the wiring layer of the built-in-component substrate using via conductors, because of the variation in height among electronic components constituting the component assembly, via holes have to be formed in the built-in-component substrate by laser processing while an output of a laser beam used in the laser processing for forming the via holes is adjusted, and the via holes thus formed have to be filled with conductive paste or have to be subjected to via-filling plating to form via conductors. It takes time and effort to perform these operations and thus the production cost of the built-in-component substrate increases. Moreover, a difference in coefficient of linear expansion between each electronic component and the general-purpose resin material is large at the junction between each via conductor and a corresponding electronic component. Thus, a stress occurs between these members since these members have largely different coefficients of expansion at which the members expand when being heated, such as in reflow. When the stress, having thus occurred between the members attributable to the difference in coefficient of linear expansion, becomes concentrated at the junction, the reliability of connection between the electronic component and the via conductor may be compromised and poor.

SUMMARY OF THE INVENTION

In view of the above problems, preferred embodiments of the present invention provide a component assembly that can be easily built in a main substrate with high accuracy.

A component assembly according to a preferred embodiment of the present invention is a component assembly that is built in a built-in-component layer of a main substrate, and the component assembly includes an assembly substrate that is built in the built-in-component layer of the main substrate and a plurality of electronic components that are arrayed and built in a built-in-component layer of the assembly substrate, wherein a glass transition temperature of the built-in-component layer of the assembly substrate is higher than a glass transition temperature of the built-in-component layer of the main substrate.

A component assembly according to another preferred embodiment of the present invention is a component assembly that is built in a built-in-component layer of a main substrate, and the component assembly includes an assembly substrate that is built in the built-in-component layer of the main substrate and a plurality of electronic components that are arrayed and built in a built-in-component layer of the assembly substrate, wherein a coefficient of linear expansion $\alpha A$ of the built-in-component layer of the main substrate, a coefficient of linear expansion $\alpha B$ of the built-in-component layer of the assembly substrate, and a coefficient of linear expansion $\alpha C$ of each electronic component satisfy the relationship $\alpha A > \alpha B > \alpha C$.

In a component assembly according to either of the preferred embodiments of the present invention described above, a plurality of electrode pads are preferably provided on a first main surface of the assembly substrate, and each electronic component is electrically connected to a corresponding one of the electrode pads.

It is preferred that the built-in-component layer of the assembly substrate and the built-in-component layer of the main substrate are both resin layers.

The electronic component may preferably be a capacitor, for example.

In the component assembly according to any of the preferred embodiments of the present invention described above, a semiconductor circuit portion may preferably be mounted on a first main surface of the main substrate and connected to a wiring layer located on a first-main-surface side of the main substrate, the wiring layer located on the first-main-surface side of the main substrate may preferably be connected to a wiring layer located on a second-main-surface side of the main substrate by a via conductor, and an electrode pad located on a first-main-surface side of the assembly substrate may preferably be electrically connected to a wiring layer located on the first-main-surface side of the main substrate.

In the component assembly according to any of the preferred embodiments of the present invention described above, a semiconductor circuit portion may preferably be mounted on a first main surface of the main substrate and connected to a wiring layer located on a first-main-surface side of the main substrate, and an electrode pad located on a first-main-surface side of the assembly substrate may preferably be electrically connected to a wiring layer located on the first-main-surface side of the main substrate and an electrode pad located on a second-main-surface side of the assembly substrate may preferably be electrically connected to a wiring layer located on a second-main-surface side of the main substrate, the electronic component built in the assembly substrate also functions as a connection conductor connecting the wiring layers on the first- and second-main-surface sides of the assembly substrate to each other.

According to a preferred embodiment of the present invention, the glass transition temperature of the built-in-component layer of the assembly substrate in which multiple electronic components are arrayed and embedded is preferably higher than the glass transition temperature of the built-in-component layer of the main substrate. Thus, thermal deformation of the assembly substrate is significantly reduced and prevented when the main substrate in which the assembly substrate is built is heated during reflow, for example. For this reason, the assembly substrate can be highly accurately built in the main substrate. Moreover, when the assembly substrate in which the multiple electronic components are embedded is built in the main substrate, the assembly substrate in which the multiple electronic components are embedded can be electrically connected to the main substrate using solder or via conductors despite the variation in height among the electronic components. Thus, the assembly substrate can be easily built in the main substrate.

Furthermore, the electronic components can be efficiently built in the main substrate when the assembly substrate in which the multiple electronic components are embedded is built in the main substrate, because a certain number of electronic components can be built in the main substrate more easily than in the case where the same number of electronic components are individually built in the main substrate. Thus, the cost of building the electronic components in the main substrate is significantly reduced.

According to another preferred embodiment of the present invention, the built-in-component layer of the assembly substrate, in which the electronic components having a small coefficient of linear expansion $\alpha C$ are arrayed and built, preferably has a coefficient of linear expansion $\alpha B$ that is smaller than a coefficient of linear expansion $\alpha A$ of the built-in-component layer of the main substrate in which the assembly substrate is embedded. Thus, when the assembly substrate in which the electronic components are built is built in the main substrate, a difference in coefficient of linear expansion between the electronic components and the built-in-component layer of the assembly substrate and a difference in coefficient of linear expansion between the built-in-component layer of the assembly substrate and the built-in-component layer of the main substrate decrease. Consequently, a stress occurring when each member expands by being heated during reflow or due to a change in atmospheric temperature, for example, decreases. Failures attributable to a stress concentrated at the junctions between components are thus prevented from occurring at the junctions. Accordingly, the electronic components can achieve highly reliable electrical connection, for example.

According to another preferred embodiment of the present invention, multiple electrode pads are preferably provided on the first main surface of the assembly substrate, and the electronic components are electrically connected to the surfaces of the electrode pads on the built-in-component layer side of the assembly substrate. Electrical connection to the electronic components can thus be achieved using the electrode pads located on the first main surface of the assembly substrate, and this is advantageous in terms of practicality.

When the assembly substrate in which the electronic components and back surfaces of the electrode pads are electrically connected to one another by soldering, for example, is built in the main substrate, thermal deformation of the assembly substrate is significantly reduced and prevented even when the main substrate in which the assembly substrate is built is heated during reflow, for example. Thus, the likelihood of a re-melting solder ejecting from the assembly substrate or the likelihood of the electrode pads or the electronic components forming a bridge with a melting solder is reduced.

The electronic components are preferably built in the main substrate after being embedded in the assembly substrate. Via conductors, which are connected to, for example, the electrode pads provided on the first main surface of the assembly substrate to achieve electric connection to the electronic components via the electrode pads, can be easily formed by laser processing and a plating technique despite the variation in height among the electronic components. This is advantageous in terms of practicality.

According to another preferred embodiment of the present invention, the built-in-component layer of the assembly substrate and the built-in-component layer of the main substrate preferably are both resin layers. Thus, it is easy to embed multiple electronic components in the resin layer of the assembly substrate and to build the assembly substrate in the built-in-component layer of the main substrate.

According to another preferred embodiment of the present invention, when cheap general-purpose capacitors each having a small capacitance are adopted as the electronic components and the capacitors are embedded in the assembly substrate, an assembly of the multiple capacitors embedded in the assembly substrate can be made to function as a large-capacitance capacitor. This dispenses with the need for an expensive large-capacitance capacitor. Moreover, by changing the number or the type of capacitors embedded in an assembly substrate, an assembly of the multiple capacitors embedded in the assembly substrate can be made to function as a capacitor having desired characteristics.

According to another preferred embodiment of the present invention, a semiconductor circuit portion is preferably mounted on a first main surface of the main substrate and the semiconductor circuit portion is connected to a wiring layer on the first-main-surface side of the main substrate. Since the electronic components are built in the main substrate while the electrode pads on the first-main-surface side of the assembly substrate are directly connected to the wiring layer on the first-main-surface side of the main substrate, each electronic component is connected to the wiring layer without using a conductive pattern such as a via conductor as in a conventional case. Thus, the distance between the electronic components and the semiconductor circuit portion can be made shorter than in the conventional case, and the length of the lines from the electronic components to the semiconductor circuit portion can be significantly reduced. Consequently, an inductance that is parasitic on the lines from the electronic components to the semiconductor circuit portion can be significantly reduced, and thus noise propagation in the lines can be significantly reduced. For example, in the case where capacitors are adopted as the electronic components, the electronic components can improve their noise-absorbing ability.

In addition, since the electrode pads on the first-main-surface side of the assembly substrate are directly connected to the wiring layer on the first-main-surface side, the length of lines from the assembly substrate to the semiconductor circuit portion is not affected by the variation in height among the electronic components. Thus, the lines from the assembly substrate to the semiconductor circuit portion can have an almost uniform length, and a parasitic inductance in the lines between the assembly substrate and the semiconductor circuit portion can be maintained at an almost constant level despite the variation in height among the electronic components. Consequently, the noise in the lines can be reliably and stably reduced and prevented. For example, in the case where capacitors are adopted as the electronic components, the electronic components can have a stable noise-absorbing ability.

Moreover, when the wiring layer on the first-main-surface side of the main substrate is electrically connected to the wiring layer on the second-main-surface side of the main substrate using via conductors, formation of lines, which connect the wiring layers to each other, in the main substrate is easily achieved by the via conductors.

According to another preferred embodiment of the present invention, a semiconductor circuit portion is preferably mounted on a first main surface of the main substrate and the semiconductor circuit portion is connected to a wiring layer on the first-main-surface side of the main substrate. The electronic components, which are built in the main substrate, are built in the main substrate while the electrode pads on the first-main-surface side of the assembly substrate are directly connected to the wiring layer on the first-main-surface side of the main substrate, and thus each electronic component is connected to the wiring layer without using conductive patterns such as via conductors as in a conventional case. Thus, the distance between the electronic components and the semiconductor circuit portion can be made shorter than in the conventional case, and the length of the lines from the electronic components to the semiconductor circuit portion can be reduced. Consequently, an inductance that is parasitic on the lines from the electronic components to the semiconductor circuit portion can be significantly reduced, and thus noise propagation in the lines can be reduced accordingly.

The electronic components also function as connection conductors between the wiring layers on both main surfaces of the assembly substrate while the electrode pads on the second-main-surface side of the assembly substrate are electrically connected to the wiring layers on the second-main-surface side of the main substrate. This configuration eliminates the need to reserve a space for forming via conductors or the like, serving as connection lines that connect the wiring layers to each other, in the main substrate, so that a space for forming via conductors or the like, which serve as other lines, can be reserved in the main substrate. Thus, the substrate can be designed with a large degree of flexibility.

Since the electronic components also function as connection conductors to connect the wiring layers on the first-main-surface side and the second-main-surface side of the main substrate to each other, there is no need to separately build a via conductor or the like, serving as a connection line to connect the wiring layer on the first-main-surface side to the wiring layer on the second-main-surface side, in the main substrate. Thus, a space for disposing the assembly substrate in the main substrate can be reserved. Consequently, limitations on the number, the size, or the location of assembly substrates that are built in the main substrate are significantly relaxed.

The electronic components are built in the main substrate after being embedded in the assembly substrate, and the electrode pads on the second-main-surface side of the assembly substrate and the wiring layer on the second-main-surface side are connected to one another. Since the length of the lines from the assembly substrate to the wiring layer on the second-main-surface side is not affected by the variation in height among the electronic components, the length of the lines from the assembly substrate to the wiring layer on the second-main-surface side can be made almost uniform. Thus, the parasitic inductance in the lines between the assembly substrate and the wiring layer on the second-main-surface side can be maintained at an almost constant level despite the variation in height among the electronic components. Accordingly, noise in the lines can be stably reduced.

The electronic components are built in the main substrate after being embedded in the assembly substrate. For example, via conductors that connect the electrode pads on the second main surface of the assembly substrate to the wiring layer on the second-main-surface side of the main substrate can be easily formed by laser processing and a plating technique despite the variation in height among the electronic components. This is advantageous in terms of practicality.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a cross-sectional view of a built-in-component substrate according to a third preferred embodiment of the present invention in which a component assembly of the present invention is built.

DETAILED DESCRIPTION OF THE PREFERRED EMBODIMENTS

First Preferred Embodiment

Referring to FIGS. 1 and 2A-2C, a built-in-component substrate according to a first preferred embodiment in which a component assembly of the present invention is built is described.

Figure 1:
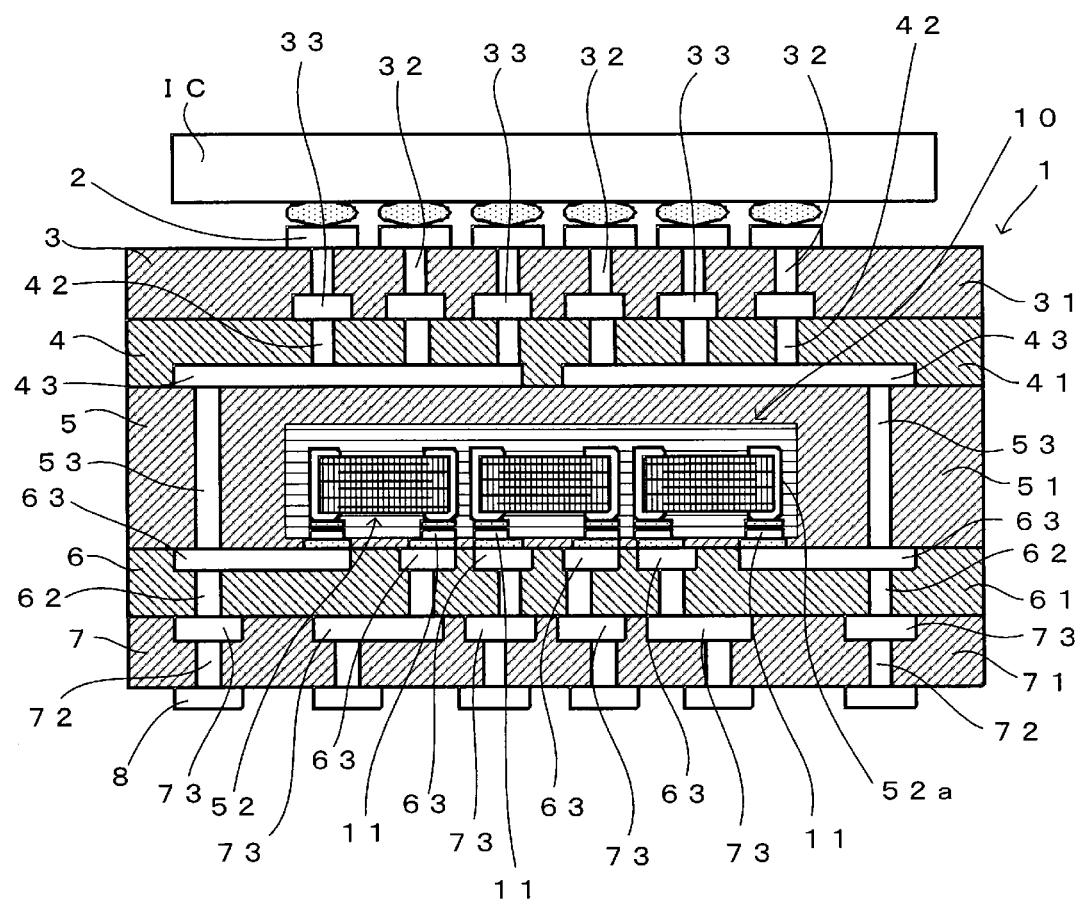
FIG. 1 is a cross-sectional view of a built-in-component substrate according to a first preferred embodiment in which a component assembly of the present invention is built.

FIG. 1 is a cross-sectional view of a built-in-component substrate 1 (corresponding to a "main substrate" according to a preferred embodiment of the present invention) according to a first preferred embodiment in which a component assembly 10 is built. As illustrated in FIG. 1, the built-in-component substrate 1 is preferably formed by stacking terminal electrode layers 2 and 8, wiring layers 3, 4, 6, and 7, and a built-in-component layer 5 on top of one another so that these layers are integrated. Moreover, terminal electrodes of an electronic component IC (corresponding to a "semiconductor circuit portion" of a preferred embodiment of the present invention), which preferably is a semiconductor circuit such as a CPU or MPU, are connected to the terminal electrode layer 2 via solder bumps or the like, so that the electronic component IC is mounted on a first main surface of the built-in-component substrate 1.

The built-in-component substrate 1 is used as a packaged component with which an electronic component IC, for example, is mounted on a motherboard via a socket or the like. In this preferred embodiment, an externally disposed power supply circuit portion, which uses a device such as a DC-DC converter or a large-capacitance capacitor, feeds direct-current power to the electronic component IC via the motherboard and the built-in-component substrate 1. The built-in-component substrate 1 according to the first preferred embodiment has a function to stabilize the direct-current power fed to the electronic component IC despite a change in consumption of electrical current consumed by the electronic component IC.

The component assembly 10 in which multiple capacitors 52 (corresponding to "electronic components" of a preferred embodiment of the present invention) are built is built in a sealing resin layer 51 of the built-in-component layer 5. If necessary, the built-in-component layer 5 includes interlayer connection conductors (via conductors) 53, which are preferably formed by filling holes with conductive paste of copper or other materials, via-filling plating, or performing other operations, for example.

The resin layer 51 is preferably made of a thermosetting resin, for example. Examples of thermosetting resins include epoxy resins, phenolic resins, and cyanate resins, for example.

The wiring layers 3, 4, 6, and 7 respectively include resin layers 31, 41, 61, and 71, which are similar to the resin layer 51. Via-structured interlayer connection conductors 32, 42, 62, and 72 and electrode patterns 33, 43, 63, and 73 are disposed at appropriate positions in the corresponding resin layers 31, 41, 61, and 71. Here, the wiring layers 3 and 4 are provided to increase intervals between a large number of connection terminal electrodes of the electronic component IC, which are disposed at a narrow pitch.

The terminal electrode layers 2 and 8 are respectively formed on first and second main surfaces of the built-in-component substrate 1 and are each formed preferably by subjecting a copper foil, for example, to laser processing or etching in accordance with a wiring pattern. End surfaces of the interlayer connection conductors 32 and 72 are brought into pressure contact with lands or pads, which are formed as the terminal electrode layers 2 and 8, end surfaces of the interlayer connection conductors 42 are brought into pressure contact with the corresponding electrode patterns 33, end surfaces of the interlayer connection conductors 53 are brought into pressure contact with the corresponding electrode patterns 43 and 63, and end surfaces of the interlayer connection conductors 62 are brought into pressure contact with the corresponding electrode patterns 73. Thus, the wiring layers 3 and 4 located on a first-main-surface side of the built-in-component substrate 1 and the wiring layers 6 and 7 located on a second-main-surface side of the built-in-component substrate 1 are electrically connected.

In this preferred embodiment, the component assembly 10 is built in the built-in-component layer 5 by directly connecting multiple electrode pads 11, which are formed on a first-main-surface side of the component assembly 10, to electrode patterns 63 of the wiring layer 6 formed on the second-surface-side of the built-in-component substrate 1 by soldering without using via conductors, wiring patterns, or the like. The electrode pads 11 and the electrode patterns 63 may be connected to one another by other methods including brazing, plating, and using conductive adhesives, for example. The component assembly 10 will be described below in detail.

Direct-current power from a power supply circuit portion, which is not illustrated, is fed to the electronic component IC, which is connected via the terminal electrode layer 2 to the wiring layers 3 and 4 located on the first-main-surface side, from the terminal electrode layer 8 through the interlayer connection conductors 32, 42, 53, 62, and 72 and the electrode patterns 33, 43, 63, and 73 of the layers 3 to 7. As described above, the terminal electrode layers 2 and 8, the wiring layers 3, 4, 6, and 7, and the interlayer connection conductors 53 constitute "power feed lines". Hereinbelow, passages through which the direct-current power is fed to the electronic component IC are called the "power feed lines". In this preferred embodiment, the component assembly 10 in which the capacitors 52 are built is connected to the power feed lines by connecting the electrode pads 11 of the component assembly 10 to the electrode patterns 63.

Now, an example of a method of manufacturing the built-in-component substrate 1 illustrated in FIG. 1 will be schematically described. Firstly, a board made of a material such as a stainless steel is prepared, and a component assembly 10 is mounted on the prepared board. A resin layer 51, which is not cured, is fed to the board so as to embed the component assembly 10 therein, and is then cured with heat. Thereafter, the interlayer connection conductors 53 are formed in the cured resin layer 51. Thus, a built-in-component layer 5 is formed. Subsequently, wiring layers 3 and 4, which have been prepared in advance, are stacked on the built-in-component layer 5. The board is then removed from the built-in-component layer 5, and wiring layers 6 and 7, which have been prepared in advance, are stacked on a surface of the built-in-component layer 5 that is opposite a surface on which the wiring layers 3 and 4 are stacked. Terminal electrode layers 2 and 8 are then formed, so that a built-in-component substrate 1 is complete.

The method of manufacturing the built-in-component substrate 1 is not limited to the above manufacturing method, and the built-in-component substrate 1 may be manufactured by any known manufacturing methods. The method of manufacturing the interlayer connection conductors 32, 42, 53, 62, and 72, the electrode patterns 33, 43, 63, and 73, and the terminal electrode layers 2 and 8 and materials of these may be appropriately adopted by selecting a known method.

Figure 2A:
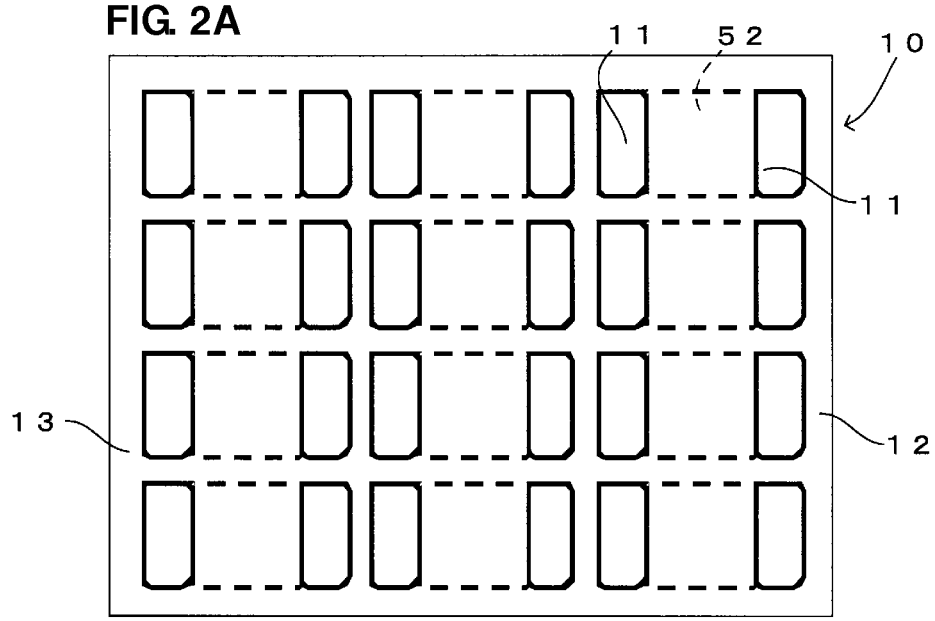
FIGS. 2A-2C illustrate an example of the component assembly.
Figure 2B:
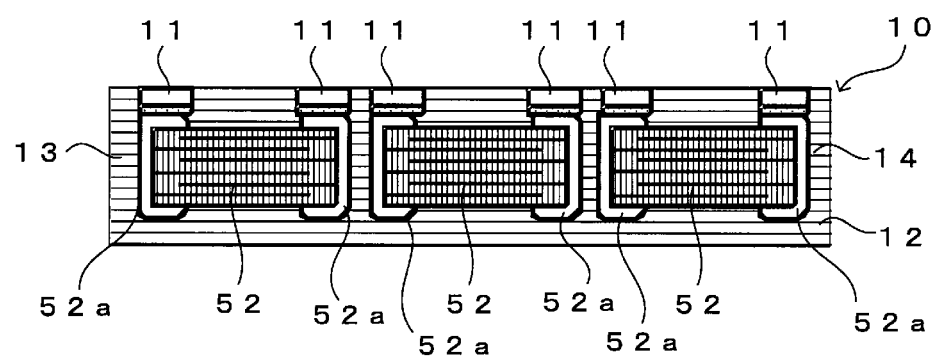
Figure 2C:
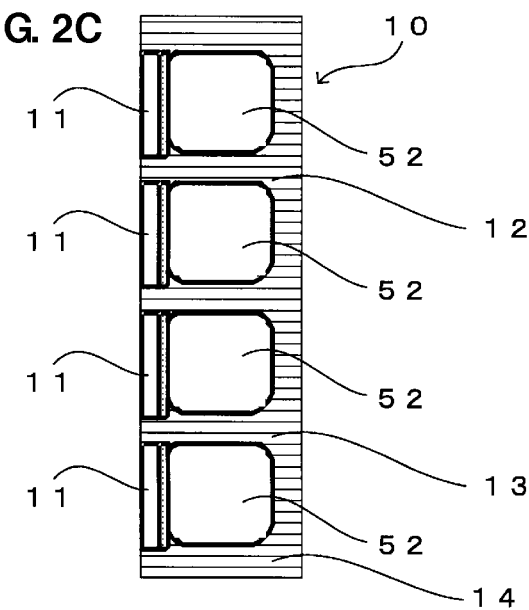

FIGS. 2A-2C illustrate an example of the component assembly 10, in which FIG. 2A is a plan view, FIG. 2B is a cross-sectional view, and FIG. 2C is a cross-sectional view on the right side.

The component assembly 10 is built in the built-in-component substrate 1. As illustrated in FIGS. 2A-2C, the component assembly 10 includes an assembly substrate 12 that is to be built in the built-in-component substrate 1, multiple capacitors 52 that are built in a built-in-component layer 13 of the assembly substrate 12 so as to be arranged in array, and multiple electrode pads 11 that are provided on a first-main-surface side of the assembly substrate 12. The built-in-component layer 13 is constituted by a resin layer 14. The resin layer 14 constituting the built-in-component layer 13 of the assembly substrate 12 in which the capacitors 52 are embedded is preferably made of a resin having a glass transition temperature that is approximately 180° C. to 190° C., for example, which is higher than the glass transition temperature (approximately 140° C. to 150° C.) of the resin layer 51 constituting the built-in-component layer 5 of the built-in-component substrate 1 in which the assembly substrate 12 is embedded.

The assembly substrate 12 is formed by embedding the chip-type capacitors 52 in the built-in-component layer 13 constituted by the sealing resin layer 14, the chip-type capacitors 52 including multilayer ceramic capacitors, three-terminal multilayer ceramic capacitors, and conductive polymer capacitors. Electrodes (outer electrodes) 52a that are plated with tin, copper, gold, or the like are disposed on left and right end portions of each capacitor 52. In this preferred embodiment, each electrode 52a of the capacitors 52 is electrically bonded, by soldering, to a surface of a corresponding electrode pad 11 that is on a built-in-component layer side of the assembly substrate.

Here, a method such as brazing, plating, or using a conductive adhesive may be used to electrically bond each electrode 52a of the capacitors 52 to the surface of a corresponding electrode pad 11 of the assembly substrate 12 that is on the built-in-component layer side of the assembly substrate. In this preferred embodiment, the multiple capacitors 52 are embedded in the built-in-component layer 13 of the assembly substrate 12 while being separated from one another. However, electrodes 52a of the capacitors 52 may be electrically connected to one another by a bonding agent, such as a solder, and the connected capacitors 52 may be integrally embedded in the built-in-component layer 13. Alternatively, an assembly of capacitors 52 formed by integrating multiple assemblies, in each of which multiple capacitors 52 are integrally arranged in array, such that the multiple assemblies are stacked on top of one another in a layered manner may be embedded in the built-in-component layer 13.

The resin layer 14 constituting the built-in-component layer 13 of the assembly substrate 12 in which the capacitors 52 are embedded is preferably made of a resin having a coefficient of linear expansion $\alpha B$ of approximately 20 ppm/° C. to 30 ppm/° C., for example, which is lower than a coefficient of linear expansion $\alpha A$ (approximately 30 ppm/° C. to 60 ppm/° C.) of the resin layer 51 constituting the built-in-component layer 5 of the built-in-component substrate 1 in which the assembly substrate 10 is embedded. The coefficient of linear expansion $\alpha C$ of the capacitors 52 is approximately 10 ppm/° C. to 20 ppm/° C.

Now, an example of a method of manufacturing the component assembly 10 illustrated in FIGS. 2A-2C will be schematically described. Firstly, a board made of a material such as a stainless steel is prepared, and an electrode pad 11 is mounted on the prepared board. While solder paste is interposed between each electrode pad 11 and a corresponding electrode 52a, multiple capacitors 52 are mounted on the board. A resin layer 14, which is not cured, is fed to the board so as to embed the capacitors 52 therein, and is then cured with heat. The built-in-component layer 13 is formed, and thus the assembly substrate 12 is formed. Each electrode pad 11 and a corresponding electrode 52a are electrically bonded to each other by soldering in reflow, so that a component assembly 10 is complete. The above described method of manufacturing the component assembly 10 is merely an example, and the component assembly 10 may be manufactured by any other suitable manufacturing method.

As described above, in this preferred embodiment, the glass transition temperature of the built-in-component layer 13 of the assembly substrate 12 (component assembly 10) in which the multiple capacitors 52 are arrayed and embedded is higher than the glass transition temperature of the built-in-component layer 5 of the built-in-component substrate 1. Thus, thermal deformation of the assembly substrate 12 is significantly reduced and prevented when the built-in-component substrate 1 in which the assembly substrate 12 is built is heated during reflow, for example. For this reason, the assembly substrate 12 can be highly accurately built in the built-in-component substrate 1.

In the above preferred embodiment, the assembly substrate 12 in which the electrodes 52a of the capacitors 52 and back surfaces of the electrode pads 11 preferably are electrically connected to one another by soldering is built in the built-in-component substrate 1. Since the assembly substrate 12 includes the built-in-component layer 13 constituted by the resin layer 14 having a high glass transition temperature, thermal deformation of the assembly substrate 12 is significantly reduced and prevented even when the built-in-component substrate 1 in which the assembly substrate 12 is built is heated during reflow, for example. Thus, it is made less likely that a re-melting solder ejects from the assembly substrate 12 or that a melting solder short-circuits the electrode pads 11 or the electrodes 52a of the capacitor 52.

In the case where electronic components such as the capacitors 52 are directly connected to the wiring layers 3 and 4 of the built-in-component substrate 1 by via conductors, the via conductors that connect the electronic components made of a material such as ceramics to the wiring layers 3 and 4 maybe cracked or fractured because a stress that occurs due to a difference in coefficient of linear expansion between the electronic components and the resin layer 51 constituting the built-in-component layer 5 is concentrated at the via conductors, by heat during reflow, for example.

In the above-described preferred embodiment, on the other hand, the component assembly 10 is built in the resin layer 51 constituting the built-in-component layer 5 of the built-in-component substrate 1, and in the component assembly 10, a coefficient of linear expansion αB of the resin layer 14 of the built-in-component layer 13, in which the capacitors 52 having a small coefficient of linear expansion αC are built so as to be arranged in array, is smaller than a coefficient of linear expansion αA of the resin layer 51 constituting the built-in-component layer 5 of the built-in-component substrate 1. Thus, a difference in coefficient of linear expansion between the capacitors 52 and the built-in-component layer 13 of the component assembly 10 and a difference in coefficient of linear expansion between the component assembly 10 and the built-in-component layer 5 of the built-in-component substrate 1 are significantly decreased. Consequently, a stress occurring when each component expands by being heated during reflow or due to a change in atmospheric temperature, for example, significantly decreases, and failures attributable to a stress being concentrated at the junctions between the components are prevented from occurring at the junctions. Accordingly, the capacitors 52 can achieve highly reliable electrical connection.

If a resin material having a high glass transition temperature and a low coefficient of linear expansion is used to make the built-in-component substrate 1, it is difficult to reduce the production cost of the built-in-component substrate 1 since such a resin material is expensive. However, by using a resin material having a high glass transition temperature and a low coefficient of linear expansion only to make the component assembly 10 that is built in the built-in-component layer 5 of the built-in-component substrate 1, an increase in production cost of the built-in-component substrate 1 can be prevented.

In addition, since the component assembly 10 can be formed by any build-up method, a special method or process for manufacturing the component assembly 10 is not required. Thus, an increase in production cost of the component assembly 10 can be avoided.

Moreover, when the assembly substrate 12 in which the multiple capacitors 52 are embedded is built in the built-in-component substrate 1, the assembly substrate 12 can be easily built in the built-in-component substrate 1 because the electrode pads 11 of the assembly substrate 12 in which the multiple capacitors 52 are embedded can be electrically connected to the wiring layers 4 and 6 of the built-in-component substrate 1 using solder or via conductors despite the variation in height among the capacitors 52. For example, the electrode pads 11 and the electrode patterns 63 are connected to one another by soldering in the above-described preferred embodiment. If, however, the wiring layer 6 (electrode patterns 63) and the electrode pads 11 are connected to one another using via conductors, the via conductors that are connected to the electrode pads 11 can be easily formed by laser processing and a plating technique despite the variation in height among the capacitors 52.

Furthermore, building of the assembly substrate 12, in which the multiple capacitors 52 are embedded, in the built-in-component substrate 1 is advantageous in terms of efficiency since a certain number of capacitors 52 can be built in the built-in-component substrate 1 more easily than in the case where the same number of capacitors 52 are individually built in the built-in-component substrate 1. Thus, the cost of building the capacitors 52 in the built-in-component substrate 1 can be reduced.

The multiple electrode pads 11 are formed on the first main surface of the assembly substrate 12, and the electrodes 52a of the capacitors 52 are electrically connected, by soldering, to the surfaces of the electrode pads 11 on the built-in-component layer side of the assembly substrate. Electrical connection to the capacitors 52 can be achieved using the electrode pads 11 formed on the first main surface of the assembly substrate 12, and this is advantageous in terms of practicality.

Since the built-in-component layers 13 and 5 of the assembly substrate 12 and the built-in-component substrate 1 are respectively constituted by the resin layers 14 and 51, it is easy to embed the multiple capacitors 52 in the resin layer 14 of the assembly substrate 12 and to build the assembly substrate 12 in the built-in-component layer 5 of the built-in-component substrate 1. Since the material of the resin layer 14 used for making the built-in-component layer 13 can be easily changed, it is easy to make the assembly substrate 12, including the built-in-component layer 13 having a high glass transition temperature, out of the resin layer 14 that is characteristic of having a higher glass transition temperature than the built-in-component layer 5 of the built-in-component substrate 1.

By embedding the assembly substrate 12, including the built-in-component layer 13 having a high glass transition temperature, in the built-in-component layer 5 of the built-in-component substrate 1, a portion of the interior of the built-in-component substrate 1 can be made of a material having a high glass transition temperature. Thus, when the built-in-component substrate 1 is formed, the material of a portion of the interior of the built-in-component substrate 1 can be changed to be a material different from that of other portion more easily than in the case of stacking the resin layer 51 having a high glass transition temperature to simply form the built-in-component layer 5.

Moreover, by embedding cheap general-purpose capacitors 52 each having a small capacitance in the assembly substrate 12, an assembly of the multiple capacitors 52 embedded in the assembly substrate 12 can be made to function as a large-capacitance capacitor. This dispenses with the need for an expensive large-capacitance capacitor. Moreover, by changing the number or the type of capacitors 52 embedded in the assembly substrate 12, an assembly of the multiple capacitors 52 embedded in the assembly substrate 12 can be made to function as a capacitor having desired characteristics. This is advantageous in terms of efficiency.

Furthermore, by electrically connecting the wiring layers 3 and 4 located on the first-main-surface side of the built-in-component substrate 1 to the wiring layers 6 and 7 located on the second-main-surface side of the built-in-component substrate 1 via the interlayer connection conductors 53, power feed lines including the via conductors (interlayer connection conductors 53) can be easily formed in the built-in-component substrate 1.

Second Preferred Embodiment

Figure 3:
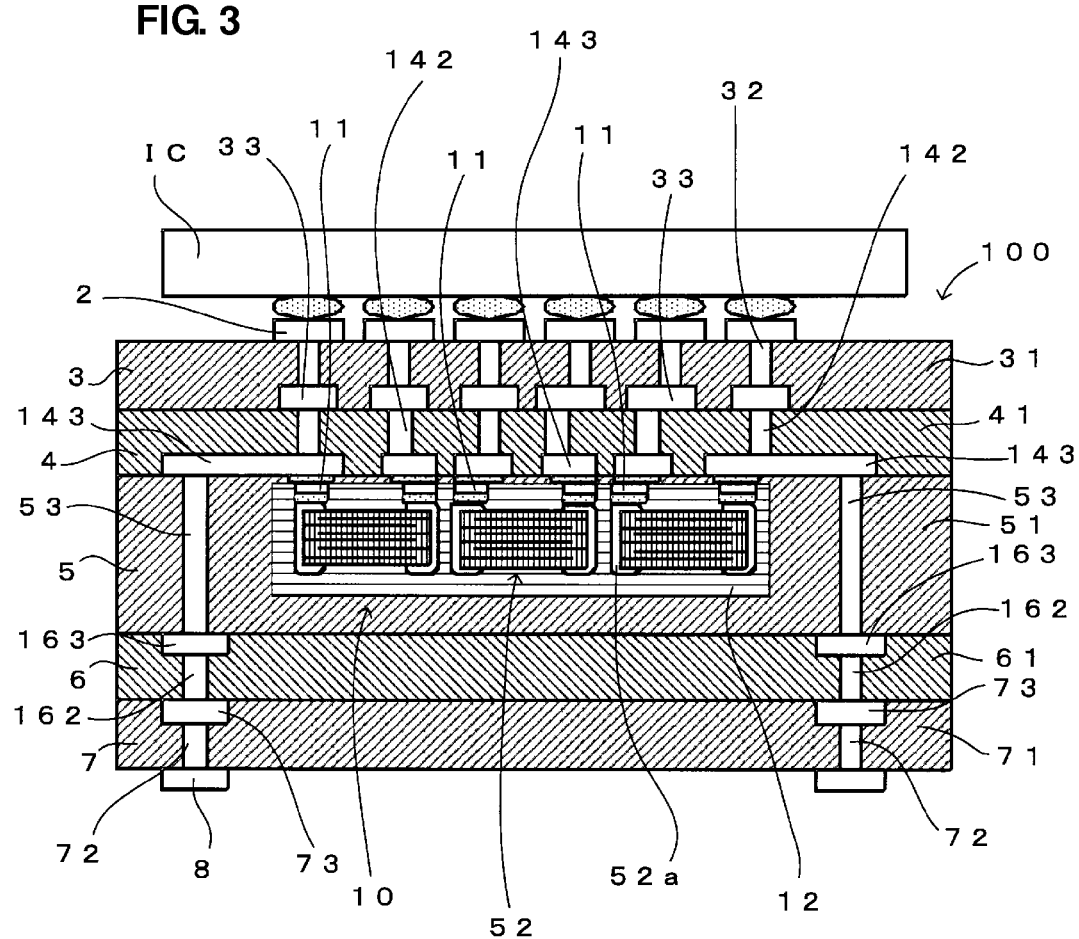
FIG. 3 is a cross-sectional view of a built-in-component substrate according to a second preferred embodiment of the present invention in which a component assembly of the present invention is built.

Referring to FIG. 3, a built-in-component substrate according to a second preferred embodiment in which a component assembly of the present invention is built will be described. FIG. 3 is a cross-sectional view of a built-in-component substrate 100 according to a second preferred embodiment in which a component assembly 10 is built.

The second preferred embodiment is different from the first preferred embodiment in terms that the electrode pads 11 formed on the first main surface of the component assembly 10 (assembly substrate 12), which serves as an electrode surface of the electrodes 52a of the capacitors 52, are electrically connected to the electrode patterns 143 of the wiring layer 4 that is located on the first-main-surface side of the built-in-component substrate 100, as illustrated in FIG. 3. The configuration related to other elements and portions is the same as that of the first preferred embodiment, and thus the elements and portions of the configuration will be denoted by the same or equivalent signs and description thereof will be omitted. As described above, the electrodes 52a of the capacitors 52 are electrically bonded, by soldering or the like, to the back surfaces of the electrode pads 11, and thus an electrode surface (electrode pad 11) is formed on the first main surface of the assembly substrate 12.

As described above, according to this preferred embodiment, the following advantageous effects can be achieved as well as the same advantageous effects as those according to the first preferred embodiment. The component assembly 10 in which the capacitors 52 are built is connected to the power feed lines through which the direct-current power of the power supply circuit portion is fed through the inside of the built-in-component substrate 100 to the electronic component IC mounted on the first main surface of the built-in-component substrate 100. The capacitors 52 are built in the built-in-component substrate 100 such that the electrode pads 11 on the first-main-surface side of the assembly substrate 12 are directly connected to the wiring layer 4 (power feed line) on the first-main-surface side of the built-in-component substrate 100.

Since the assembly substrate 12 (capacitors 52) is connected to the wiring layer 4 without using a conventional conductive pattern such as a via conductor, the distance between the assembly substrate 12 and the electronic component IC can be made shorter than in the conventional case. Thus, the length of the power feed lines from the assembly substrate 12 to the electronic component IC can be reduced, and an inductance that is parasitic on the power feed lines from the assembly substrate 12 to the electronic component IC can be reduced. Consequently, noise propagation in the lines can be reduced, and thus the electronic component IC can have better response characteristics.

In addition, since the electrode-pad-11 surface on the first-main-surface side of the assembly substrate 12 is directly connected to the wiring layer 4 on the first-main-surface side of the built-in-component substrate 100, the length of the lines from the assembly substrate 12 to the electronic component IC is not affected by the variation in height among the capacitors 52. Thus, the lines from the assembly substrate 12 to the electronic component IC can have an almost uniform length, and a parasitic inductance in the lines between the assembly substrate 12 and the electronic component IC can be maintained at an almost constant level despite the variation in height among the capacitors 52. Consequently, the noise in the lines can be reliably and stably reduced and prevented, and the electronic component IC can have stable response characteristics.

With the above configuration, the parasitic inductance in the power feed lines between the electronic component IC and the assembly substrate 12 (capacitors 52) can be reduced further than in the conventional case. The electronic component IC can thus have better response characteristics. Consequently, the number of capacitors 52 used to improve the response characteristics of the electronic component IC can be reduced, and the cost of manufacturing the built-in-component substrate 1 can be accordingly reduced.

Note that the layers 3 to 7 and the assembly substrate 12 are highly accurately formed by using dies and thus have thicknesses that are approximately the same as originally designed.

Third Preferred Embodiment

Figure 5A:
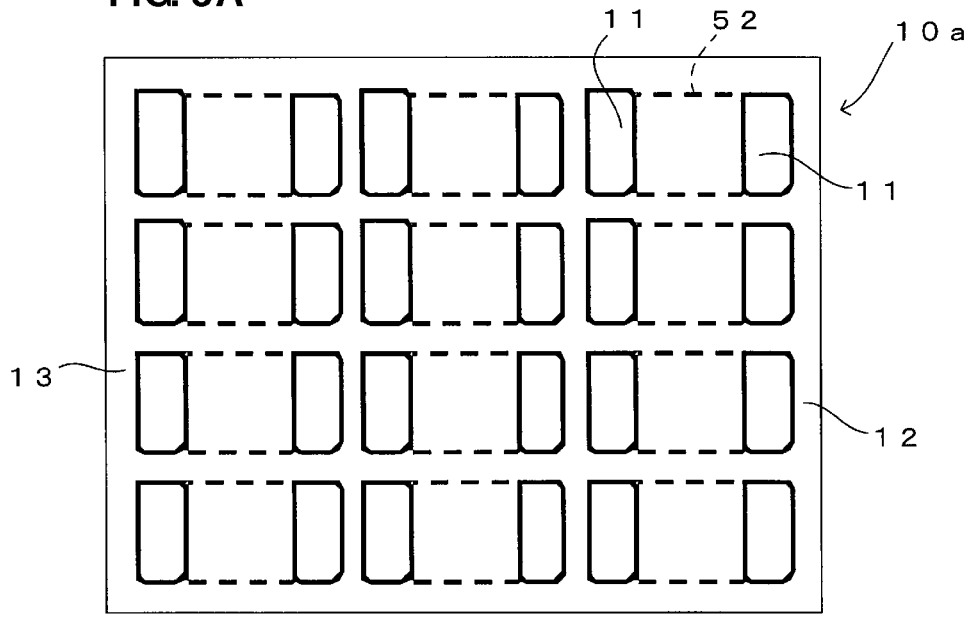
FIGS. 5A-5C illustrate an example of the component assembly.
Figure 5B:
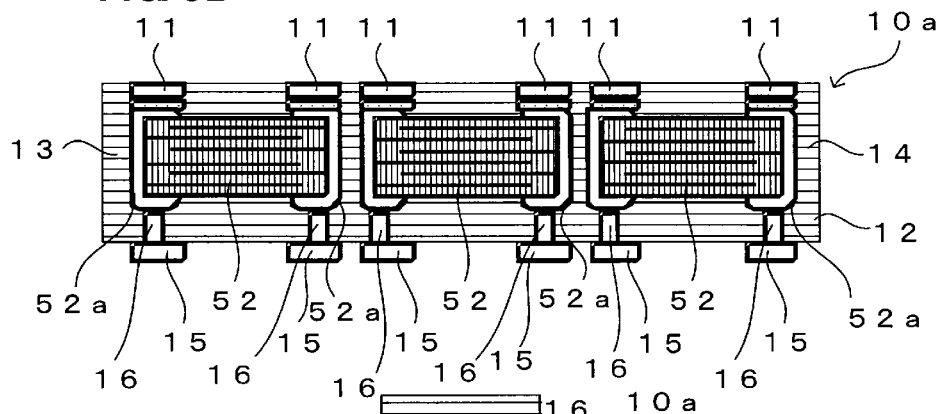
Figure 5C:
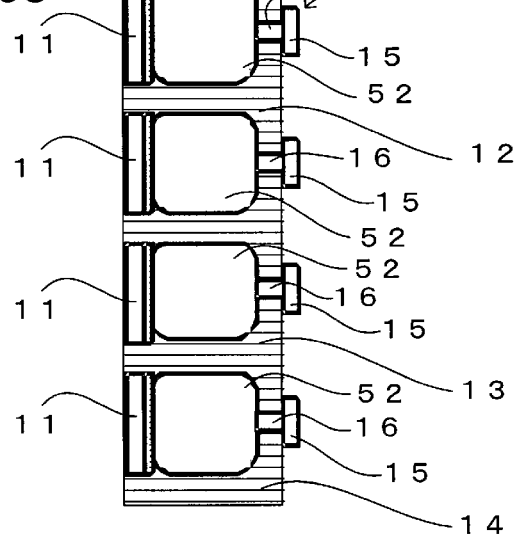
Figure 6:
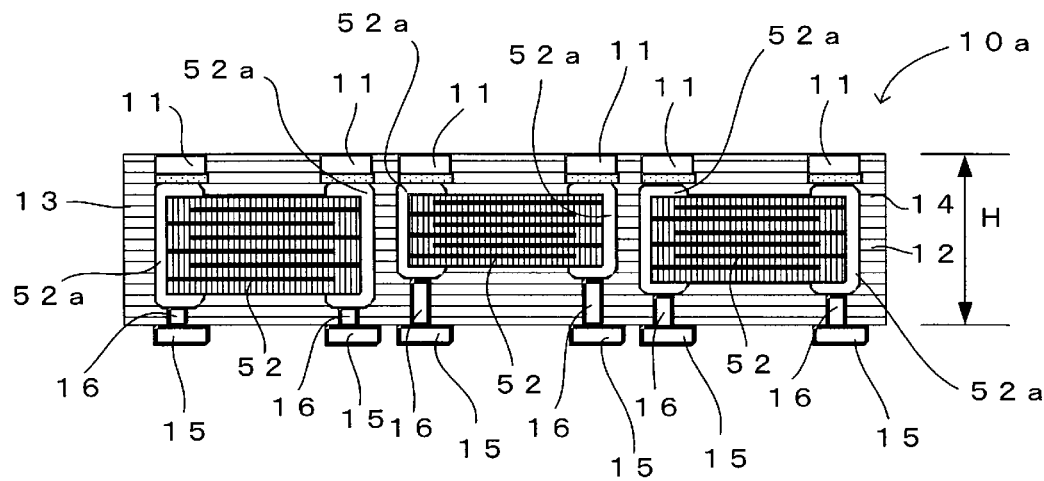
FIG. 6 illustrates that the height of the component assembly is almost uniform.
Figure 7A:
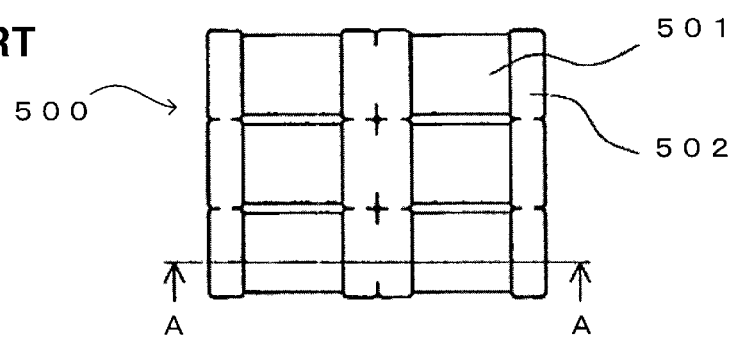
FIGS. 7A and 7B illustrate an example of a conventional capacitor unit.
Figure 7B:
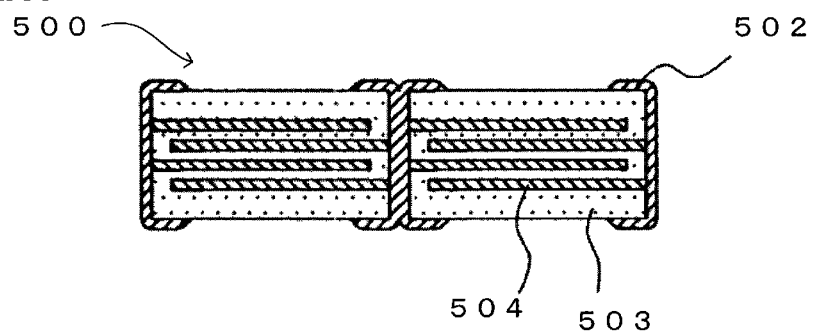

Referring to FIGS. 4 to 6, a built-in-component substrate according to a third preferred embodiment of the present invention in which a component assembly of the present invention is built will be described.

The third preferred embodiment is different from the second preferred embodiment in terms that a component assembly 10a has a different configuration as illustrated in FIG. 4. Hereinbelow, description will focus on points that are different from the first and second preferred embodiments, and elements and portions of the configuration that are similar to those of the first and second preferred embodiments will be denoted by the same or equivalent signs and description thereof will be omitted.

FIG. 4 is a cross-sectional view of a built-in-component substrate 200 according to a third preferred embodiment in which a component assembly 10a is built. As illustrated in FIG. 4, in this preferred embodiment, the built-in-component layer 5 is formed by building a component assembly 10a, which has electrode pads 11 and 15 on its first and second main surfaces, in the sealing resin layer 51.

The electrode pads 11 formed on the first main surface of the component assembly 10a are electrically connected, by soldering or the like, directly to electrode patterns 243 of the wiring layer 4 on a first-main-surface side of the built-in-component substrate 200. The electrode pads 15 formed on the second main surface of the component assembly 10a are electrically connected to electrode patterns 263 of the wiring layer 6 on a second-main-surface side of the built-in-component substrate 200 via interlayer connection conductors 253 formed in the built-in-component layer 5. As described above, in this preferred embodiment, the capacitors 52 (electrodes 52a) are also used as power-feed-line conductors (connection conductors) between the wiring layers 4 and 6.

FIGS. 5A-5C illustrate an example of the component assembly 10a, wherein FIG. 5A is a plan view, FIG. 5B is a cross-sectional view, and FIG. 5C is a cross-sectional view on the right side.

As illustrated in FIGS. 5A-5C, the component assembly 10a includes multiple electrode pads 11 formed on the first main surface of the assembly substrate 12 and electrode pads 15 formed on the second main surface of the assembly substrate 12. First sides of the electrodes 52a of the capacitors 52 are electrically bonded to the back surface sides of the electrode pads 11 by soldering, and second sides of the electrodes 52 are electrically bonded to the electrode pads 15 via interlayer connection conductors 16.

In this preferred embodiment, the electrode pads 15 are formed preferably by plating on the second main surface of the assembly substrate 12 with copper. Since copper reflects a laser beam with a high reflectance, it is easy to accurately form, by laser processing, via holes for forming the interlayer connection conductors 253 that are connected to the electrode pads 15 on the assembly substrate 12 embedded in the resin layer 51 of the built-in-component layer 5 of the built-in-component substrate 200. It is thus easy to form the interlayer connection conductors 253 that connect the electrode pads 15 on the assembly substrate 12 to the electrode patterns 263 of the wiring layer 6 of the built-in-component substrate 200.

In this preferred embodiment, the capacitors 52 built in the assembly substrate 12 may be any type of capacitor 52 that has outer electrodes on its upper and lower surfaces.

As described above, according to this preferred embodiment, the same advantageous effects as those according to the first and second preferred embodiments can be achieved. The assembly substrate 12 (capacitors 52) also functions as power-feed-line conductors (connection conductors) between the wiring layers 4 and 6 while the electrode pads 15 on the second-main-surface side of the assembly substrate 12 are electrically connected to the wiring layers 6 and 7 on the second-main-surface side of the built-in-component substrate 200. This configuration eliminates the need to reserve a space for forming via conductors or the like, serving as power feed lines (connection lines) to connect the wiring layers 4 and 6 to each other, in the built-in-component substrate 200, so that a space for forming via conductors or the like, which serve as lines other than the power feed lines, can be reserved in the built-in-component substrate 200. Thus, the built-in-component substrate 200 can be designed with a large degree of flexibility. It is also possible to build various lines in the built-in-component substrate 200 without increasing the size of the substrate, and thus the size reduction of the built-in-component substrate 200 can be achieved.

When the assembly substrate 12 (capacitors 52) also functions as a connection conductor to connect the wiring layer 4 on the first-main-surface side of the built-in-component substrate 200 to the wiring layer 6 on the second-main-surface side of the built-in-component substrate 200, the assembly substrate 12 can also function as a power-feed-line conductor that connects the electronic component IC to the power supply circuit portion that is connected to the terminal electrode layer 8. Unlike in the first and second preferred embodiments described above, there is no need to separately build via conductors or the like, serving as power feed lines for connecting the wiring layers 3 and 4 on the first-main-surface side of the built-in-component substrate 200 to the wiring layers 6 and 7 on the second-main-surface side of the built-in-component substrate 200, in the built-in-component substrate 200. Thus, a space for disposing the assembly substrate 12 in the built-in-component substrate 200 can be reserved. Consequently, limitations on the number, the size, or the location of assembly substrates 12 that are built in the built-in-component substrate 200 can be significantly relaxed.

The capacitors 52 are built in the built-in-component substrate 200 after being embedded in the assembly substrate 12 as illustrated in FIG. 6. Thus, even the heights of the capacitors 52 are different from one another, the assembly substrate 12 is formed so as to have an approximately uniform height H since the assembly substrate 12 is highly accurately formed by using a die. Thus, when the assembly substrate 12 is embedded in the built-in-component layer 5 of the built-in-component substrate 200, it is easy to accurately form via conductors (interlayer connection conductors 253), which electrically connect the electrode pads 15 on the second-main-surface side of the assembly substrate 12 to the electrode patterns 263 of the wiring layer 6 on the second-main-surface side of the built-in-component substrate 200, by laser processing and a plating technique despite the variation in height among the capacitors 52. Consequently, the assembly substrate 12 and the wiring layer 6 are more stably and reliably connected to each other. FIG. 6 illustrates that the height H of the component assembly 10a is almost uniform.

The capacitors 52 are built in the built-in-component substrate 200 after being embedded in the assembly substrate 12, and the electrode pads 15 on the second-main-surface side of the assembly substrate 12 and the wiring layer 6 on the second-main-surface side of the built-in-component substrate 200 are connected to one another. Since the length of the lines from the assembly substrate 12 to the wiring layer 6 on the second-main-surface side is not affected by the variation in height among the capacitors 52, the length of the lines from the assembly substrate 12 to the wiring layer 6 on the second-main-surface side can be made almost uniform. Thus, the parasitic inductance in the lines (interlayer connection conductor 253) between the assembly substrate 12 and the wiring layer 6 on the second-main-surface side can be maintained at an almost constant level despite the variation in height among the capacitors 52. Accordingly, noise in the interlayer connection conductors 253 can be stably and reliably reduced and prevented.

In the configuration as illustrated in FIG. 6, the power feed lines from the power supply circuit portion to the electronic component IC can be reduced in length, and the power feed lines from the power supply circuit portion to the assembly substrate 12 (capacitors 52) can be made shorter than those according to the first and second preferred embodiments. Thus, the inductance that is parasitic on the power feed lines from the power supply circuit portion to the assembly substrate 12 can be reduced, and the power supply circuit portion can have better response characteristics.

Since the assembly substrate 12 (capacitors 52) is connected to the power feed lines by being interposed in the power feed lines extending from the power supply circuit portion to the electronic component IC, there is no need to separately provide a line that connects the power feed lines to the assembly substrate 12. This enables a stable reduction of high-frequency noise that occurs in a line when the line is separately provided to connect the power feed lines to the assembly substrate 12.

Other Preferred Embodiments

The present invention is not limited to the above-described preferred embodiments, and can be modified to various forms other than the above-described preferred embodiments without departing from the gist of the present invention. For example, the built-in-component substrate 1, 100, or 200 maybe formed by embedding multiple assembly substrates 12 in the built-in-component layer 5. In the above described preferred embodiments, description has been given by taking a case, as a non-limiting example, where the capacitors 52 serving as the electronic components are embedded in the assembly substrate 12, which preferably functions as a decoupling circuit. However, the electronic components that are embedded in the assembly substrate 12 are not limited to the capacitors 52, and various other types of electronic components, such as resistors, coil elements, and ICs may be embedded in the assembly substrate 12 to form a component assembly 10 or 10a. By embedding various other types of electronic components in the assembly substrate 12, the component assembly 10 or 10a may be made to function as another type of a circuit, such as a filter circuit.

When a capacitor is used in which an inner electrode is built in a direction that is substantially the same as the direction of the power feed lines extending from the wiring layer 6 to the wiring layer 4 while the component assembly 10 or 10a (assembly substrate 12) is built in the built-in-component substrate 1, 100, or 200, further reduction of impedance (reduction of induction) can be achieved.

Various preferred embodiments of the present invention can be applied to various component assemblies each including an assembly substrate that is built in a main substrate while multiple electronic components are embedded in the assembly substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component assembly provided in a layer of a main substrate, the component assembly comprising:
    an assembly substrate provided in the layer of the main substrate; and
    a plurality of electronic components provided in a layer of the assembly substrate; wherein
    the plurality of electronic components include a plurality of outer electrodes;
    a plurality of electrode pads are provided on a first main surface of the assembly substrate, and each of the plurality of electronic components is electrically connected to a corresponding one of the plurality of electrode pads;
    each of the plurality of outer electrodes is electrically connected to a respective one of the plurality of electrode pads in the assembly substrate;
    the main substrate includes a plurality of electrode patterns that are electrically connected to respective ones of the plurality of electrode pads in the layer of the main substrate; and
    a glass transition temperature of the layer of the assembly substrate is higher than a glass transition temperature of the layer of the main substrate.

2. The component assembly according to claim 1, wherein the layer of the assembly substrate and the layer of the main substrate are both resin layers.

3. The component assembly according to claim 1, wherein at least one of the plurality of electronic components is a capacitor.

4. The component assembly according to claim 1, wherein a semiconductor circuit portion is mounted on a first main surface of the main substrate and connected to a wiring layer located on a first-main-surface side of the main substrate;
    the wiring layer located on the first-main-surface side of the main substrate is connected to a wiring layer located on a second-main-surface side of the main substrate by a via conductor; and
    an electrode pad of the plurality of electrode pads located on a first-main-surface side of the assembly substrate is electrically connected to the wiring layer located on the first-main-surface side of the main substrate.

5. The component assembly according to claim 1, wherein a semiconductor circuit portion is mounted on a first main surface of the main substrate and connected to a wiring layer located on a first-main-surface side of the main substrate; and
    an electrode pad of the plurality of electrode pads located on a first-main-surface side of the assembly substrate is electrically connected to the wiring layer located on the first-main-surface side of the main substrate and an electrode pad of the plurality of electrode pads located on a second-main-surface side of the assembly substrate is electrically connected to a wiring layer located on a second-main-surface side of the main substrate, the electronic component built in the assembly substrate defines a connection conductor that connects the wiring layers on the first-main-surface side and the second-main-surface side of the assembly substrate to each other.

6. The component assembly according to claim 1, wherein the main substrate includes a plurality of terminal electrode layers, a plurality of wiring layers, a plurality of interlayer connection conductors, and the layer containing the assembly substrate.

7. The component assembly according to claim 1, wherein the plurality of electronic components include chip capacitors of different types embedded in the layer of the main substrate.

8. The component assembly according to claim 1, wherein the plurality of electronic components includes at least one of capacitors, resistors, coil elements, and integrated circuits.

9. The component assembly according to claim 1, further comprising a plurality of the assembly substrates provided in the layer of the main substrate.

10. A component assembly provided in a layer of a main substrate, the component assembly comprising:
    an assembly substrate provided in the layer of the main substrate; and
    a plurality of electronic components provided in a layer of the assembly substrate; wherein
    the plurality of electronic components include a plurality of outer electrodes;
    a plurality of electrode pads are provided on a first main surface of the assembly substrate, and each of the plurality of electronic components is electrically connected to a corresponding one of the plurality of electrode pads;
    each of the plurality of outer electrodes is electrically connected to a respective one of the plurality of electrode pads in the assembly substrate;
    the main substrate includes a plurality of electrode patterns that are electrically connected to respective ones of the plurality of electrode pads in the layer of the main substrate; and
    a coefficient of linear expansion $\alpha A$ of the layer of the main substrate, a coefficient of linear expansion $\alpha B$ of the layer of the assembly substrate, and a coefficient of linear expansion $\alpha C$ of each of the plurality of electronic components satisfy a relationship $\alpha A > \alpha B > \alpha C$.

11. The component assembly according to claim 10, wherein the layer of the assembly substrate and the layer of the main substrate are both resin layers.

12. The component assembly according to claim 10, wherein at least one of the plurality of electronic components is a capacitor.

13. The component assembly according to claim 10, wherein a semiconductor circuit portion is mounted on a first main surface of the main substrate and connected to a wiring layer located on a first-main-surface side of the main substrate;
    the wiring layer located on the first-main-surface side of the main substrate is connected to a wiring layer located on a second-main-surface side of the main substrate by a via conductor; and
    an electrode pad of the plurality of electrode pads located on a first-main-surface side of the assembly substrate is electrically connected to the wiring layer located on the first-main-surface side of the main substrate.

14. The component assembly according to claim 10, wherein
    a semiconductor circuit portion is mounted on a first main surface of the main substrate and connected to a wiring layer located on a first-main-surface side of the main substrate; and
    an electrode pad of the plurality of electrode pads located on a first-main-surface side of the assembly substrate is electrically connected to the wiring layer located on the first-main-surface side of the main substrate and an electrode pad of the plurality of electrode pads located on a second-main-surface side of the assembly substrate is electrically connected to a wiring layer located on a second-main-surface side of the main substrate, the electronic component built in the assembly substrate defines a connection conductor that connects the wiring layers on the first-main-surface side and the second-main-surface side of the assembly substrate to each other.

15. The component assembly according to claim 10, wherein the main substrate includes a plurality of terminal electrode layers, a plurality of wiring layers, a plurality of interlayer connection conductors, and the layer containing the assembly substrate.

16. The component assembly according to claim 10, wherein the plurality of electronic components include chip capacitors of different types embedded in the layer of the main substrate.

17. The component assembly according to claim 10, wherein the plurality of electronic components includes at least one of capacitors, resistors, coil elements, and integrated circuits.

18. The component assembly according to claim 10, further comprising a plurality of the assembly substrates provided in the layer of the main substrate.

* * * * *